United States Patent [19]

Gupta et al.

[11] 4,184,135
[45] Jan. 15, 1980

[54] BREAKAPART SINGLE TURN RF INDUCTION APPARATUS

[75] Inventors: Kedar P. Gupta; J. W. Thousand, Jr., both of St. Louis, Mo.

[73] Assignee: Monsanto Company, St. Louis, Mo.

[21] Appl. No.: 894,884

[22] Filed: Apr. 10, 1978

[51] Int. Cl.² .......................... H01F 27/28; H05B 5/08
[52] U.S. Cl. .................................. 336/62; 219/10.79; 336/223; 336/232
[58] Field of Search ................ 336/62, 223, 232, 200; 219/10.43, 10.29, 10.67, 10.57

[56] References Cited

U.S. PATENT DOCUMENTS

| | | | |
|---|---|---|---|
| 2,649,527 | 8/1953 | Chapman et al. | 336/62 X |
| 2,847,651 | 8/1958 | Schamanek | 336/200 |
| 3,008,027 | 11/1961 | Beckius et al. | 219/10.79 |
| 3,342,970 | 9/1967 | Emeis | 219/10.43 |
| 3,603,760 | 9/1971 | Cheliuskintser et al. | 219/10.79 |
| 3,809,846 | 5/1974 | Baumgartner et al. | 219/10.79 |
| 3,827,017 | 7/1974 | Keller | 336/62 |
| 3,886,509 | 5/1975 | Keller | 336/62 |
| 3,898,413 | 8/1975 | Keller | 219/10.79 |

Primary Examiner—Thomas J. Kozma
Attorney, Agent, or Firm—Henry Croskell

[57] ABSTRACT

A breakapart single turn RF induction coil suitable for use in zone refining production of large diameter semiconductor rods is described wherein the coil is engagable and disengagable from mounted semiconductor rods without breaking the rod or mounting welds. The work coil consists of two spaced apart sections; however connected at one or both ends of a slit formed between the two sections with current and coolant flow through the connection means on the outer peripheral of the sections. The arrangement affords the use of a single turn coil having the capacity for removal from a float zone without disruption of the semiconductor rod mounting.

2 Claims, 7 Drawing Figures

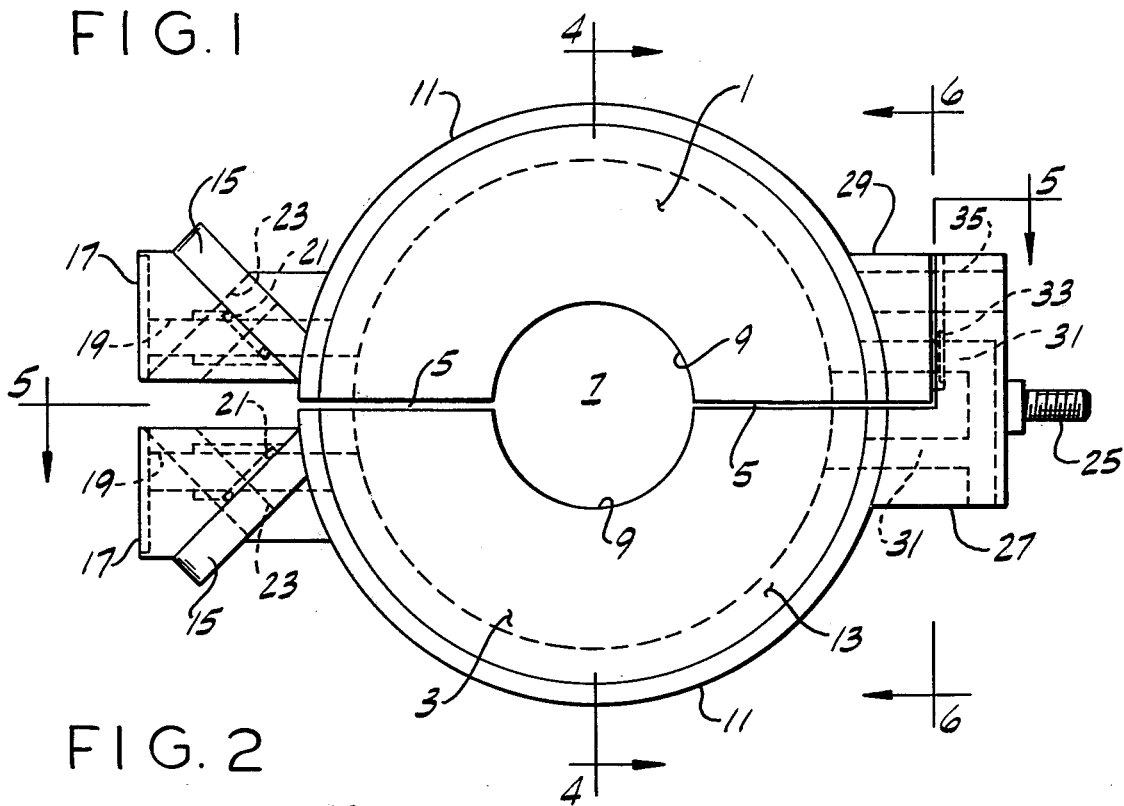
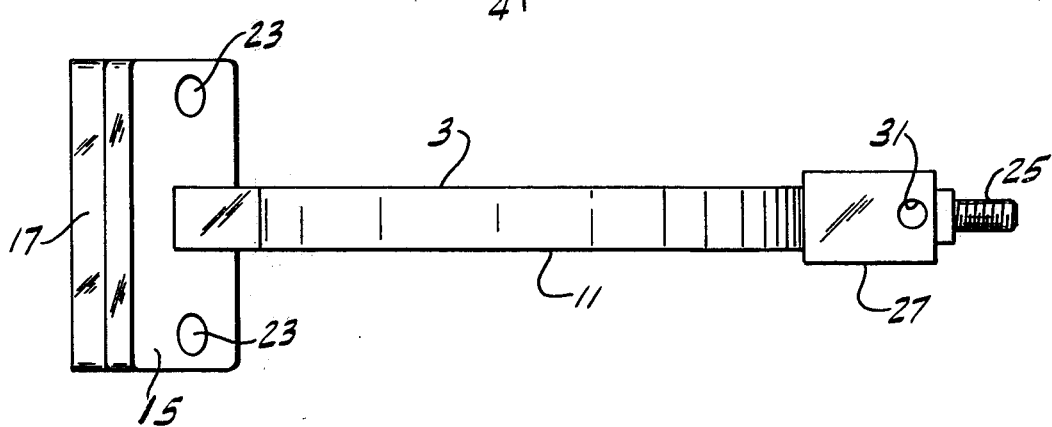
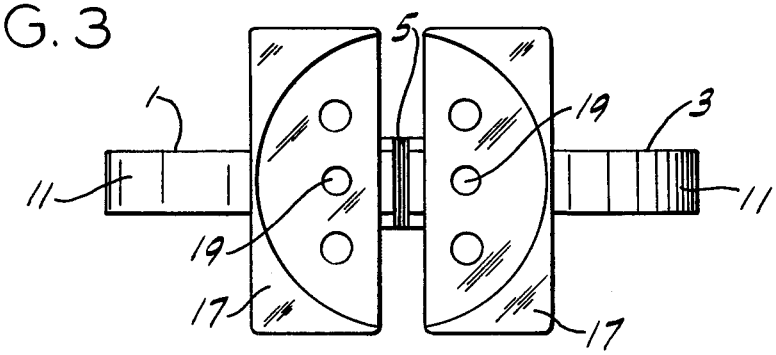

BREAKAPART SINGLE TURN RF INDUCTION APPARATUS

BACKGROUND OF THE INVENTION

The present invention pertains to float zone refining of semiconductor material rods and more particularly to a breakapart single turn work coil suitable for manufacturing large diameter monocrystal and polycrystalline semiconductor rods.

Float zone refining or zone melting is a method which has been commercially employed for many years to produce monocrystal semiconductor materials as well as purifying polycrystalline semiconductor materials, such as silicon. These methods produce rod materials ordered having the extremely high purity and crystalline lattice structure without dislocations which are required for making certain electronic devices. The general float zone refining process as disclosed in Keller U.S. Pat. No. 2,922,311. A more recent commercial float zone refining process configuration is disclosed in Campbell U.S. Pat. No. 3,734,695.

Float zone refining of such semiconductor materials is often referred to simply as zone refining and the latter expression is used in this disclosure.

In this process or variations thereof, a molten zone is initially produced at a selected location on, for example, a silicon rod or other semiconductor rod by inductive radio frequency (RF) heating. If the rod is polycrystalline silicon, the molten zone is initially seeded with a small monocrystalline seed crystal. Thereafter, the molten zone is moved along the rod by the production of relative motion between the rod and an adjacent RF induction heating coil encircling the rod. Such relative motion may be provided by well-known mechanical means, such as motor driven shafts, and the traverse rate of the molten zone along the rod will depend upon the required quality of the crystal and upon the power of the RF field produced by the adjacent induction heating coil. In the selection of the above parameters to determine the traverse rate, care must be taken to prevent zone spill over and/or arcing as will be appreciated by those skilled in the art. There may be one pass or a plurality of passes of the molten zone along the length of the rod to achieve a desired ultimate purity, crystalline lattice structure, and/or rod diameter.

Conventional work coils generally are comprised of single turn coils made of a metal, preferably copper, silver or silver plated copper, and having an outside diameter of about 2 to 6 inches (50.8 to 152.5 mm) and an inside diameter of about 1 to 2 inches (25.4 to 50.8 mm), a coil thickness at the outer peripheral of about 0.40 inches (10.16 mm), and a gap spacing between ends of about 0.23 inches (3.05 mm). These sizes are exemplary and may vary depending upon the size of the rod to be refined. Typically, the outside diameter may be about 2 inches (50.8 mm) larger than the rod.

The electronics industry has an ever increasing demand for larger silicon wafers which must, in turn, be cut from larger diameter silicon crystal rods. However, heretofore there has been no known method for multiple pass zone refining and/or adjustable zone refining insitu without breaking the rod from its welded inplace mounting; thus involving waste due to rod breakage.

One of the obvious problems encountered in producing ever increasingly larger silicon crystal rod diameters is found in the use of one turn or single turn coils commonly used in zone processing. Inner diameter of these single turn coils are smaller than the diameter of the feed rod. This geometric relationship poses an ever increasing problem for first passes as rods must be turned around for the final pass in the production of single or monocrystal material. It has not been possible to melt the feed rod up to the carbon handle or weld. At the end of the pass, silicon rods frequently have deficiency problems commonly known as burrs in forms of fingers, and are very difficult to melt. Any effort to melt these protruding burrs completely results in spill overs and arcing, which in turn seriously deteriorates chances for good controllable lattice structure yield. The only way to take the rod from the coil, even after a successful freeze out, that is, a zone process wherein the burrs problem is not a common appearance, is to chip away the material extending beyond the coil opening. Frequently the neck breaks as a result of chipping and another carbon has to be welded thereto. This dismounting process of the rods involves more handling of the zone pass rod and increases chances for fractures of the rod. Frequently such multihandled rods must be scrapped because of the resulting fractures and defects.

SUMMARY OF THE INVENTION

Among the several objects of the invention is the provision of an apparatus for zone refining semiconductor rods; the provision of an RF single turn induction work coil for such zone refining; and the provision of a breakapart single turn RF induction work coil and system which minimizes rod handling defects and losses.

Accordingly, it is an object of this invention to provide an RF induction coil capable of being removed from a float zone without disruption of the semiconductor rod mounting.

It is a further object of this invention to provide a single turn RF induction coil which is capable of being separated from insitu zone refining use positions without dismounting the semiconductor rod, the breakapart single turn RF induction coil being suitable for use in zone refining of large diameter semiconductor rods and the production of large diameter semiconductor rods.

A further object of the invention is to provide a breakapart turn RF induction coil having an annular body comprised of two spaced apart sections while having single turn connection means for both the current and coolant flow.

Briefly, the apparatus according to the invention successfully alleviates the handling problems as discussed hereinabove. The breakapart coil operates in quite the same way as a regular one turn or single turn coil, but is capable of being taken apart after the end of the first zone refining pass. The resulting first zone refining pass rod does not require removal from the top chuck mounting. No handling of the rod is required since the breakapart coil according to the invention is removed from its encirclement of the rod. The breakapart single turn coil permits a decrease in turn around time, and improves chances for higher quality semiconductor rod yield. In addition, during first zone refining passes, if the pass run is stopped for any reason before finishing the whole rod, the breakapart coil can be easily removed from the rod without losing the whole rod as is frequently the case with nonbreakapart coils. That is, an art taught single turn coil permits no removal thus there is no way to take the rod out of the coil and it must be scrapped.

As noted, the work coil is a breakapart or two part single turn work coil having two arcuate portions or if desired a plurality of arcuate portions of a single full turn, each of the portions meeting at extremities thereof with other of said portions creating a single full turn inclusive of electrical contact and coolant channeling. Preferrably the single turn breakapart work coil is composed of two similar arcuate portions or sections with the RF input ports adjacent to the slit formed between the spaced apart sections. The work coil according to the invention can be RF driven by known means and utilizes any of the apparatus wherein the standard art taught single turn coils are now utilized.

BRIEF DESCRIPTION OF THE DRAWINGS

FIG. 1 is a top plan view of a breakapart single turn RF induction coil inclusive of only one connection means and adapators for the RF and coolant input ports;

FIG. 2 is a side elevation view of the breakapart single turn RF induction coil of FIG. 1;

FIG. 3 is an end view of the breakapart single turn RF induction coil of FIG. 1 looking at the RF and coolant input ports with the adaptors in place;

DETAILED DESCRIPTION OF THE PREFERRED EMBODIMENT

Two embodiments of the breakapart single turn RF induction coil according to the invention are illustrated respectively in FIGS. 1-6 and FIG. 7. The inventive coil according to FIGS. 1-6 present a breakapart single turn RF induction coil suitable for producing large diameter semiconductor rods and having the capacity for disengagement from mounted rods, comprising an annular body having spaced apart coil sections having upper and lower surfaces, an outer peripheral surface connecting the respective outer edges of said upper and lower surfaces of said sections, and an inner peripheral surface connecting the respective inner edges of said upper and lower surfaces of said sections defining an inner opening of the annular body; a slit between the sections and in communication with the annular body inner opening; connection means on the outer peripheral and at respective ends of the slit; and current and ground means in contact with the single turn RF induction coil annular body at approximately opposite sides of the body.

Figure 7:
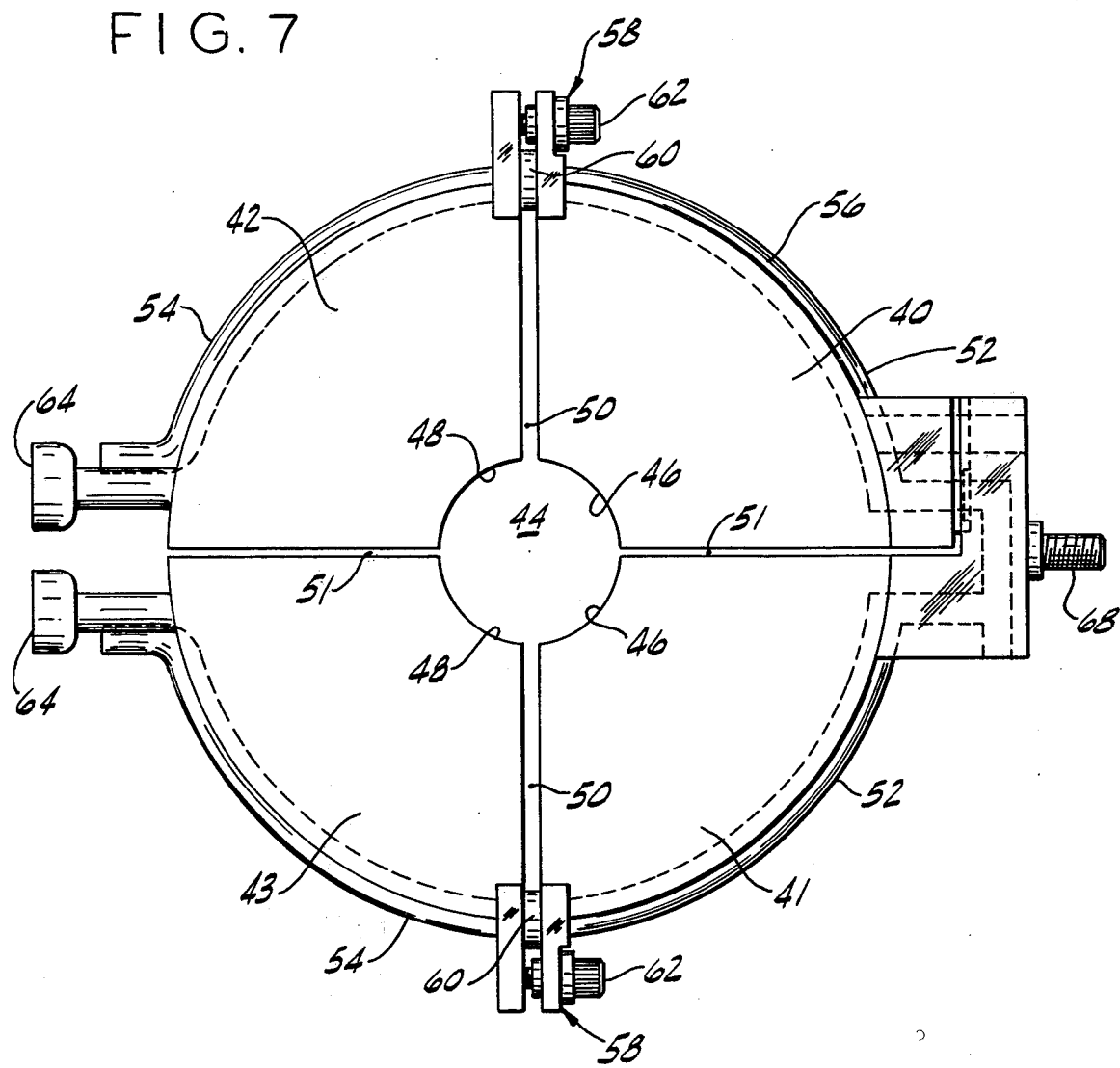
FIG. 7 is a top plan view showing a second adaptation of the breakapart single turn RF induction coil having connection means at the ends of the slit formed between the sections.

The inventive coil of FIG. 7 presents a breakapart single turn RF induction coil suitable for producing large diameter semiconductor rods and having the capacity for being removed from mounted rods, comprising an annular body having four spaced apart sections, said sections having upper and lower surfaces, an outer peripheral surface connecting the respective outer edges of said upper and lower surfaces of the sections and an inner peripheral surface connecting the respective inner edges of said upper and lower surfaces of the sections defining an inner opening of the annular body; slits between the sections and in communication with the annular body inner opening; connection and ground means at one end of a slit and current receiving means at a second end of the slit.

Referring now to FIG. 1, there is shown a top plan view of the breakapart single turn RF induction coil apparatus in accordance with the present invention. The breakapart coil of FIG. 1 represents one embodiment of the invention wherein the coil consists of a first coil section and a second coil section defining therebetween a slit 5 and an annular body opening 7. The coil sections 1 and 3 have inner peripheral surfaces 9 and outer peripheral surfaces 11. The breakapart coil according to the invention also utilizes a coolant through a hollow coolant chamber 13 with said coolant chamber communicating through the connection means of the breakapart coil.

The breakapart coil of FIG. 1 utilizes the combination of flange arms 15 and adaptor blocks 17 in order to form parallel input coolant chambers 19 through the utilization of coolant chamber O-rings 21. The flange arms 15 and adaptor blocks 17 are affixed to each other through bolt channels 23. The adaptor blocks 17 permit parallel coolant and circuitry input into the breakapart coil permitting the breakapart coil to be connected at only one point, i.e., at the ground end or the opposite end of slit 5. Ground 25 terminates the connection end overlapping arm portion 27 and connection block portion 29 which hold the breakapart coil together for use purposes. The connection portions 27 and 29 also include a connection coolant chamber 31 with chamber O-ring 33 which will afford a continuous coolant flow. The connection portions 27 and 29 also afford a breakapart single turn RF induction coil according to the invention, continuous one turn current flow grounding through element 25. The connection arm portion 27 and connection block portion 29 are connected through connection portion tensioning bolt channels 35 which in turn hold the two part or breakapart coil together during use.

It will be seen in FIGS. 2, 3, 4, 5 and 6, the specific relationship of the various apparatus embodiments discussed relevant to FIG. 1. The side elevation view of the breakapart single turn RF induction coil of FIG. 1 as presented in FIG. 2 readily illustrates the RF input port in geometric relationship to the ground 25, connection overlapping arm portion 27 and connection collant chamber 31. The end view of FIG. 1 taken from the RF and coolant input ports with the adaptor blocks in place illustrates the separated flange arms 15 in combination with the adaptor blocks 17 thereby providing parallel entry of the coolant inport chambers 19 and the first coil section 1, second coil section 3 with the defined slit 5 therebetween.

Figure 4:
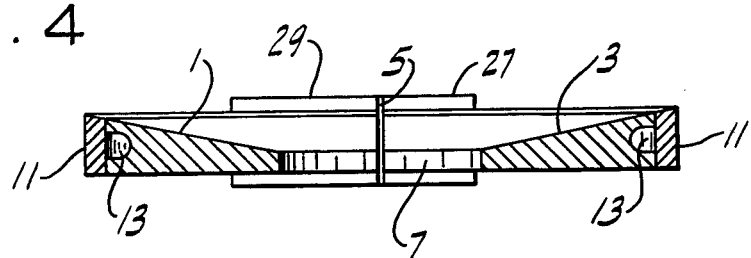
FIG. 4 is an end sectional view along line 4—4 of FIG. 1.
Figure 5:
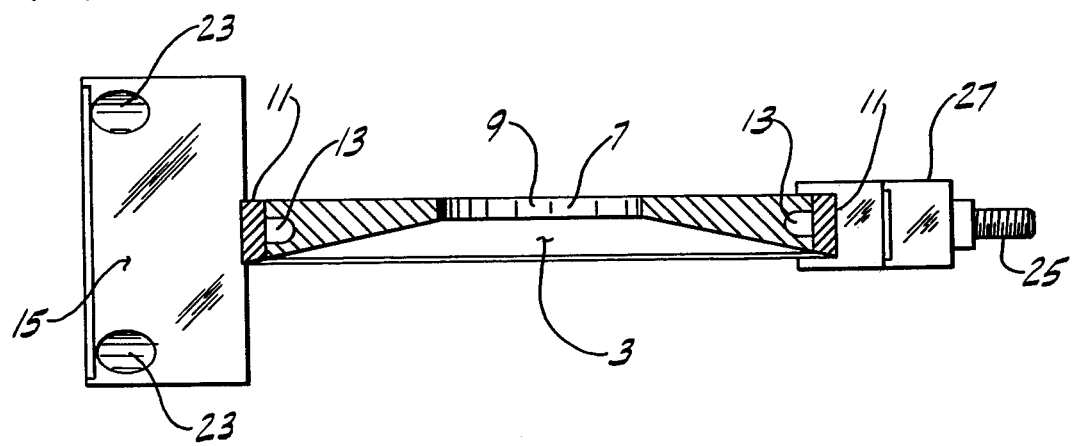
FIG. 5 is a side sectional view taken along 5—5 of FIG. 1.
Figure 6:
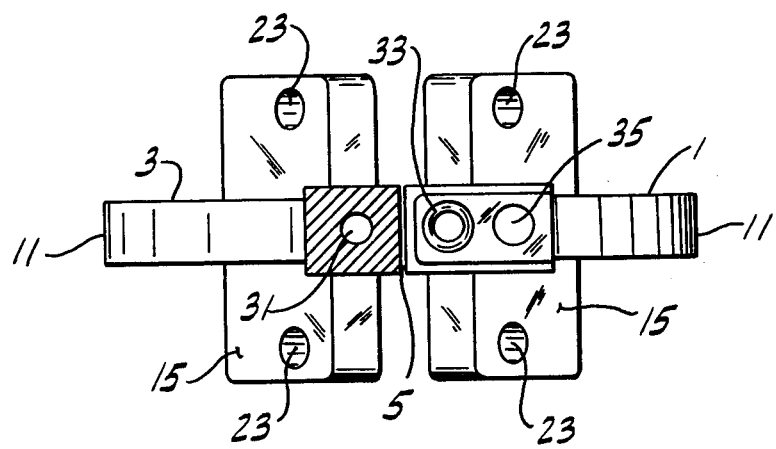
FIG. 6 is an end sectional view taken along line 6—6 of FIG. 1.

Turning now to FIGS. 4, 5 and 6, these views are sectional views taken along definitive lines of FIG. 1. For example, FIG. 4 is an end sectional view along line 4—4 of FIG. 1 which illustrates the first coil section 1 and second coil section 3 with definitive slit 5 therebetween as well as the communication of the slit 5 and opening 7. In addition, FIG. 4 illustrates the relative positioning of connection overlapping arm portion 27 and connection block portion 29. The hollow coolant channel 13 in the particular adaptation of FIG. 1 is also illustrated to be a continuing single turn type coolant coil as is the basic electrical structure. A side sectional view taken along line 5—5 of FIG. 1 is illustrated in FIG. 5 and is for the purpose primarily of illustrating in more detail the functional connection overlapping arm portion 27 in relationship to the ground 25, opening 7, and flange arm 15. FIG. 6 presents an end sectional view taken along line 6—6 of FIG. 1 and in more detail illustrates the continuous connectional functions of O-ring 33 of connection coolant chamber 31 with specific emphasis on the slit 5 as being continuously between the breakapart first and second coil sections 1 and 3.

Referring now to FIG. 7, another embodiment of the breakapart single turn RF induction coil according to the invention is presented in a top plan view showing the coil having connection means at the ends of the slit 50 and 51 which are between two halves of the coil i.e., ground side coil section 40 and RF input coil section 42, and halves 41 and 43. The coil sections 40,41,42 and 43 define in addition a rod encircling opening 44 which is in communication with slits 50 and 51. The coil sections have inner peripheral surfaces 46 and 48. Also referenced respectively are outer peripheral surfaces 52 and 54 with the apparatus inclusive of a coil coolant chamber and tensioning blocks 58 through which a coolant chamber communicates through connection 60. The tensioning bolts 62 can also serve a function in another embodiment of the invention as alternative current connectors, however in the inventive embodiment represented by FIG. 7, the RF input ports 64 form a single turn coil device through coil sections RF connectors which allow communication with ground 68. This multiple arcuate section coil permits breaking apart from either the x or y axis depending on float zone equipment design and use.

Although a rod of polycrystalline silicon or other semiconductor material to be zone refined is not shown, it will be understood that the breakapart single turn RF induction coil is adapted to encircle the rod for producing a molten zone in the rod in the vicinity of the coil by inductively coupling RF energy to the rod. Certainly not shown are conventional means for causing relative motion between the coil and the rod to cause the molten zone to pass along the length of the rod.

The dimensions and angles of the various parts of the breakapart single turn RF induction coil will vary as the size of the silicon feed rod or monocrystal are changed. As pointed out above, coils for producing larger diameter semiconductor rods through float zone procedures require an apparatus i.e., a breakapart coil which affords the capacity for removal from the mounted rod thus avoiding handling damages and promoting higher quality end rod melts. Growth of high quality semiconductor rods through float zone apparatus also requires symmetry of current and heat.

In view of the foregoing, it will be seen that the several objects of the invention are achieved and other advantages are attained.

As various changes could be made in the constructions herein described without departing from the scope of the invention, it is intended that all matter contained in the foregoing description or shown in the accompanying drawings shall be interpreted as illustrative rather than in a limiting sense.

What is claimed:

1. A breakapart single turn RF induction coil suitable for producing large diameter semiconductor rods and having the capacity for being removed from mounted rods, comprising:
   an annular body having two spaced apart sections, said sections having upper and lower surfaces, an outer peripheral surface connecting the respective outer edges of said upper and lower surfaces of the sections and an inner peripheral surface connecting the respective inner edges of said upper and lower surfaces of the sections defining an inner opening of the annular body;
   said annular body having an interior forming a hollow chamber for conducting a coolant fluid through said body with the spaced apart section hollow chambers communicating through the connection means;
   a slit between the sections and in communication with the annular body inner opening;
   connection and ground means at one end of said slit and current receiving means at a second end of said slit; and
   connection and ground means comprised of a first section having a connection and ground end block portion and a second section having a connection and ground end overlapping arm portion, said portions aligned and mated with a tensioning bolt in place in alignment channels of said portions; said portions inclusive of a hollow chamber communication O-ring connection and current carrying connections to the ground means.

2. A breakapart single turn RF induction coil suitable for producing large diameter semiconductor rods and having the capacity for being removed from mounted rods, comprising:
   an annular body having two spaced apart sections, said sections having upper and lower surfaces, an outer peripheral surface connecting the respective outer edges of said upper and lower surfaces of the sections and an inner peripheral surface connecting the respective inner edges of said upper and lower surfaces of the sections defining an inner opening of the annular body;
   a slit between the sections and in communication with the annular body inner opening;
   connection and ground means at one end of said slit and current receiving means at a second end of said slit comprised of two flange arm elements having an angle of about 90° therebetween and adaptor blocks which attach to said flange arm elements inclusive of hollow chamber O-rings; said adaptor blocks forming parallel current receiving and coolant receiving heads.

* * * * *